United States Patent [19]

Amano

[11] Patent Number: 4,519,002
[45] Date of Patent: May 21, 1985

[54] CONTROLLING THE OPERATIONS OF AT LEAST TWO DEVICES

[75] Inventor: Toshio Amano, Tokyo, Japan

[73] Assignee: Sony Corporation, Tokyo, Japan

[21] Appl. No.: 313,346

[22] Filed: Oct. 20, 1981

[30] Foreign Application Priority Data

Oct. 30, 1980 [JP] Japan ................................ 55-152739

[51] Int. Cl.³ .................... H04N 5/76; H04N 5/64; H04M 11/10
[52] U.S. Cl. .................................. 358/335; 358/188; 358/194.1; 369/29; 340/825.63
[58] Field of Search ................ 358/188, 191.1-192.1, 358/193.1, 194.1, 335; 340/825.61, 825.63, 825.64, 825.72, 825.69, 825.15; 307/115, 141, 141.4, 141.8; 455/352, 603, 151; 179/90 B; 369/29

[56] References Cited

U.S. PATENT DOCUMENTS

| | | | |
|---|---|---|---|
| 3,944,982 | 3/1976 | Mogi et al. ................. | 340/825.63 |
| 4,045,777 | 8/1977 | Mietzwinski et al. ...... | 340/825.69 X |
| 4,151,557 | 4/1979 | Iida et al. ................... | 358/188 |
| 4,209,668 | 6/1980 | Weinberger et al. ....... | 179/90 B |
| 4,243,845 | 1/1981 | Feinberg et al. ........... | 179/90 B |
| 4,322,855 | 3/1982 | Mogi et al. ................. | 358/194.1 X |
| 4,325,081 | 4/1982 | Abe et al. ................... | 350/335 |
| 4,332,021 | 5/1982 | Plunkett, Jr. ............... | 369/29 |
| 4,334,242 | 6/1982 | Mangold ..................... | 358/194.1 X |
| 4,337,480 | 6/1982 | Bourassin et al. .......... | 358/194.1 X |
| 4,338,632 | 7/1982 | Falater ........................ | 340/825.63 X |

Primary Examiner—Aristotelis M. Psitos
Attorney, Agent, or Firm—Lewis H. Eslinger; Alvin Sinderbrand

[57] ABSTRACT

Remote control apparatus is provided for generating and transmitting remote control signals for controlling the operations of one or more devices. For example, the remote control apparatus may be used to control video playback and display devices, whereby previously recorded video signals may be played back and displayed. The apparatus includes a plurality of selector switches, each being selectively operable to initiate the transmission of a respective command signal for commanding a corresponding operation in the controlled devices. An encoder is coupled to the selector switches and is responsive to the operation of a respective one thereof to generate an encoded command signal. This command signal is transmitted to the controlled devices, wherein it is received and utilized to implement the commanded operation. A selectively operable control switch also is provided. A control circuit is coupled to the encoder and is responsive to the operation of the control switch to simulate successive operations of the plural selector switches, whereby the encoder responds to the operation of the control switch to generate successive encoded command signals.

16 Claims, 10 Drawing Figures

CONTROLLING THE OPERATIONS OF AT LEAST TWO DEVICES

BACKGROUND OF THE INVENTION

This invention relates to remote control apparatus for controlling, from a remote location, predetermined operations of cooperating devices and, more particularly, to such apparatus wherein separate, incremental operations that must be carried out by such devices in order to permit a desired function to be performed are remotely controlled by a simple, single manipulation of such apparatus.

It is convenient and, in many instances, desirable, to control various operations of one or more devices from a remote location. For example, a user of home entertainment devices, such as a television receiver, a video record and/or playback device, and the like, may find it advantageous to operate such devices from the comfort of a remote location. Remote controlling apparatus, including a portable hand-held transmitter, is known wherein the user actuates function-selector switches, such as push-button switches, to command the operation of selected functions. For example, television remote control transmitter devices may be provided with selector switches, each operable to command an on/off operation, a channel-select operation, a sound volume control operation, and the like. Other remote control transmitters may be provided with selector switches which are selectively operable to control a video playback operation, a video record operation, stop-motion, slow-motion or scan operations, and the like. The latter operations may be commanded from a remote location and carried out by, for example, a video tape recorder (VTR) which is capable of recording and reproducing video signals for display on a television receiver. In such remote control transmitters, the command functions generally are represented by encoded command signals which are transmitted to the television receiver or VTR via ultrasonic, infrared and other modulated carriers.

Typically, when video information which has been recorded previously on a suitable record medium, such as video tape, is to be reproduced and displayed on the television receiver, the VTR must be disposed in its playback mode, the television receiver must be tuned to a predetermined, unused channel (i.e. a channel which normally is not used by any television transmitters in the reception area in which the television receiver is located), and the receiver electronics included in the television receiver must be electrically connected to the output playback electronics of the VTR. These conditions are readily attained by the user when he operates his remote control transmitter apparatus accordingly. Heretofore, the foregoing three conditions are established by three separate operations of the remote control transmitter apparatus. Usually, this requires the user to operate a VTR playback switch, and then a television channel-selector switch, and then a VTR/TV connection switch, all of which may be provided on the user's remote control transmitter apparatus. In response to the VTR playback switch, a signal is transmitted from the remote control transmitter apparatus, this signal being received and detected by suitable remote control receiving apparatus coupled to the VTR. In response to this received command signal, the VTR is disposed in its playback mode. Similarly, in response to the operation of the television channel-select switch, a channel-select command signal is transmitted, this signal being received by remote control receiver apparatus coupled to the televison receiver, whereupon this received signal is detected and used to select the appropriate unused channel. Likewise, in response to the operation of the VTR/TV connection switch, a VTR/TV connection command signal is transmitted, this signal being received by appropriate remote control receiver apparatus whereat it is detected and used to establish the necessary electrical interconnection between the VTR playback circuitry and the video circuitry of the television receiver. As one example, the command signals are transmitted in the form of digital signals, each digital signal being comprised of a multiple of bits to represent the corresponding command, and each digital signal being transmitted as, for example, an amplitude-modulated signal wherein a suitable carrier is amplitude-modulated. As mentioned above, this carrier may be an ultrasonic carrier, an infrared carrier, or the like.

A typical remote control transmitter generally includes numerous selector switches in addition to the aforementioned VTR playback switch, television channel select switch and VTR/TV connection switch. Therefore, in order to dispose the VTR/TV combination in proper, respective modes so as to enable video signals which are reproduced by the VTR to be displayed by the television receiver, the user must take care in operating the proper selector switches of his remote control transmitter. As a result, it is possible that the controlled devices may be disposed in unwanted modes or conditions, resulting in the performance of undesired functions. Furthermore, the operation of many selector switches in order to establish what the user perceives to be a simple playback mode may be troublesome to him.

OBJECTS OF THE INVENTION

Therefore, it is an object of the present invention to provide improved remote control apparatus which overcomes the aforenoted disadvantages.

Another object of this invention is to provide improved remote control apparatus which is relatively simple to operate and which disposes plural, cooperating devices in proper operating modes so that a desired operation may be carried out thereby.

A further object of this invention is to provide remote control apparatus which is particularly useful for controlling video playback and display devices so that prerecorded video signals may be played back and displayed on the display device.

An additional object of this invention is to provide remote control apparatus which functions to control plural operations of interconnected devices in response to a simple, single manipulation of a control switch.

Various other objects, advantages and features of the present invention will become readily apparent from the ensuing detailed description, and the novel features will be particularly pointed out in the appended claims.

SUMMARY OF THE INVENTION

In accordance with this invention, remote control apparatus is provided for generating and transmitting remote control signals for controlling the operations of plural devices, such as the operations of video playback and display devices. The apparatus includes a plurality of selector switches, each of which is selectively operable to command a respective device to carry out a predetermined operation. For example, the selector switches may include a playback command switch to command the video playback device to perform a playback operation, a channel select switch to command the video display device to select a predetermined channel over which played back video signals are displayed, and a connection command switch to command the establishing of an electrical connection between the video playback and display devices through which the played back video signals are coupled from the video playback device to the video display device. The remote control apparatus also includes an encoder coupled to the selector switches to generate an encoded representation of that switch which has been operated, and a transmitter coupled to the encoder for transmitting the encoded representation to the plural devices as an encoded command signal. In accordance with a preferred aspect of this invention, a selectively operable control switch is coupled to control circuitry which, in turn, is coupled to the encoder and is responsive to the operation of the control switch to simulate successive operations of the plural selector switches, whereby the encoder responds to the operation of the control switch to generate successive plural command signals, thereby commanding the plural devices to carry out the aforementioned predetermined operations. When the present invention is used with video playback and display devices, the operation of the control switch causes the encoder to generate playback, channel-select and connection command signals, whereby the video playback device performs a playback operation, the video display device selects a predetermined channel, and an electrical connection is established between the video playback and display devices.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
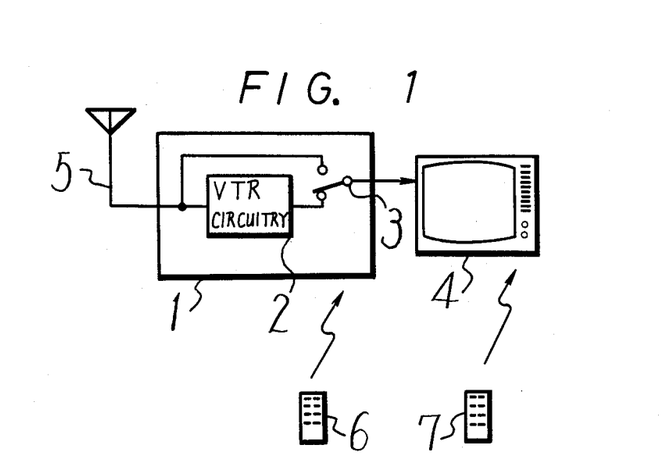
FIG. 1 is a schematic representation of the combination of video playback and display devices with which the present invention is employed.

Referring now to the drawings, FIG. 1 is a block diagram of remotely controllable devices 1 and 4 which are capable of carrying out predetermined operations in response to commands which are transmitted thereto from remote transmitters 6 and 7, respectively. In a preferred application, these remotely controlled devices are constructed as a video record and/or playback device 1 and a video display device 4. For example, the record and/or playback device may be a video tape recorder (VTR) having VTR circuitry 2 coupled to a receiving antenna 5 for receiving and processing video signals which are recorded on, for example, magnetic tape (not shown). VTR 1 may be a conventional video tape recorder capable of operating in record, playback, still, slow-motion, scan, fast-forward and rewind modes, respectively. Suitable push-button switches (not shown) may be provided directly on VTR 1, which push-button switches, when operated, serve to initiate respective ones of the foregoing operations. During a record mode, for example, video signals are received at receiving antenna 5, coupled to VTR circuitry 2 whereat they are suitably processed, and recorded on the magnetic tape. During a playback mode, the previously recorded signals are reproduced from the magnetic tape, supplied to VTR circuitry 2, and then coupled to a suitable video display device.

Video display device 4 may comprise a television monitor, a television receiver, or other conventional video display device having, preferably, a display screen, video and audio signal processing circuitry, and an audio transducer. When constructed as a conventional television set, display device 4 also is provided with tuner circuitry which is selectively operable to tune the television receiver circuitry to a desired one of available television broadcast channels. A television program which is transmitted over the selected, or tuned, channel will be suitably received and displayed by the television receiver, thereby permitting a viewer to view the transmitted television program. As is also conventional, in order to display the video signals which are reproduced by VTR circuitry 2 from previously recorded video tape, television receiver 4 is tuned to an "unused" broadcast channel. That is, a channel which normally is not used by any television broadcast stations in the reception area, or zone, in which television receiver 4 is located is selected. Then, the video signals which are reproduced by the VTR are supplied via this "unused" channel to the television receiver, whereat such reproduced signals are processed and displayed.

As illustrated in FIG. 1, a switch 3 is diagrammatically represented as being provided to selectively couple display device 4 either to VTR circuitry 2 or directly to receiving antenna 5. The purpose of switch 3 is to connect television receiver 4 to receiving antenna 5 during non-playback modes so as to enable broadcasted television signals to be received and displayed by the television receiver. Thus, television programs may be displayed independently of the operation of VTR 1. Switch 3 also connects the television receiver to the output of VTR circuitry 2 such that, when VTR 1 is disposed in its playback mode, the reproduced video signals may be coupled from the playback circuitry of the VTR to the television receiver, thereby allowing the viewer to view such reproduced signals. Hence, switch 3 functions as a change-over switch.

If desired, and as is conventional, VTR 1 may include separate tuning circuitry such that, during a recording mode of operation, television signals which are transmitted via one broadcast channel may be received and recorded by VTR 1, while television signals transmitted via another broadcast channel may be received and displayed by television receiver 4. Still further, VTR circuitry 2 may include an output terminal coupled to change-over switch 3 so as to supply to television receiver 4 those television signals which are received and processed by the tuning circuitry included in the VTR. In this manner, television receiver 4 functions as a video monitor to enable the viewer to observe the nature and quality of those television signals which are being recorded by the VTR.

Remote control units 6 and 7 preferably are portable, hand-held command signal transmitters, each being provided with a multiple of function-selector switches which, when operated, commands either the VTR or the television receiver to carry out a desired operation. For example, remote control unit 6 may selectively command VTR 1 to carry out a record, playback, still-motion, slow-motion, scan, rewind or fast-forward operation, depending upon the particular selector switch which is actuated. Remote control unit 7 may control television receiver 4 to carry out an on/off, volume control, channel-select or picture control operation, depending upon the particular selector switch which has been actuated. In this regard, remote control units 6 and 7, as well as the remote control receiving devices used therewith, are conventional. In the interest of brevity, further discussion thereof is not provided.

It is appreciated that, in order to control VTR 1 and television receiver 4 such that a playback operation is carried out thereby, remote control unit 6 must be operated so as to dispose VTR 1 in its playback mode. Remote control unit 7 must be operated so as to control television receiver 4 to select the "unused" channel over which the video signals reproduced by VTR 1 are received. Still further, remote control unit 6 or 7 must be operated so as to dispose change-over switch 3 in its illustrated position, thereby electrically interconnecting VTR circuitry 2 with television receiver 4 so as to permit the video signals which are reproduced by the VTR to be coupled to the television receiver. It is appreciated that, in order to condition the VTR and television receiver for a video playback operation, as aforementioned, three separate operations must be initiated by, for example, operating three separate selector switches of the remote control units. Even if units 6 and 7 are combined in a single unit, three separate operations still must be initiated by operating three separate selector switches. As mentioned above, the requirement of separate, plural manual operations may result in the inadvertent actuation of an undesired selector switch, thereby initiating an improper operation. Also, an inexperienced user might be confused in operating his remote control unit, thereby resulting in error. Still further, the user might find such separate manual operations, in order to establish what he perceives to be a relatively simple mode of operation, to be quite troublesome.

Figure 2:
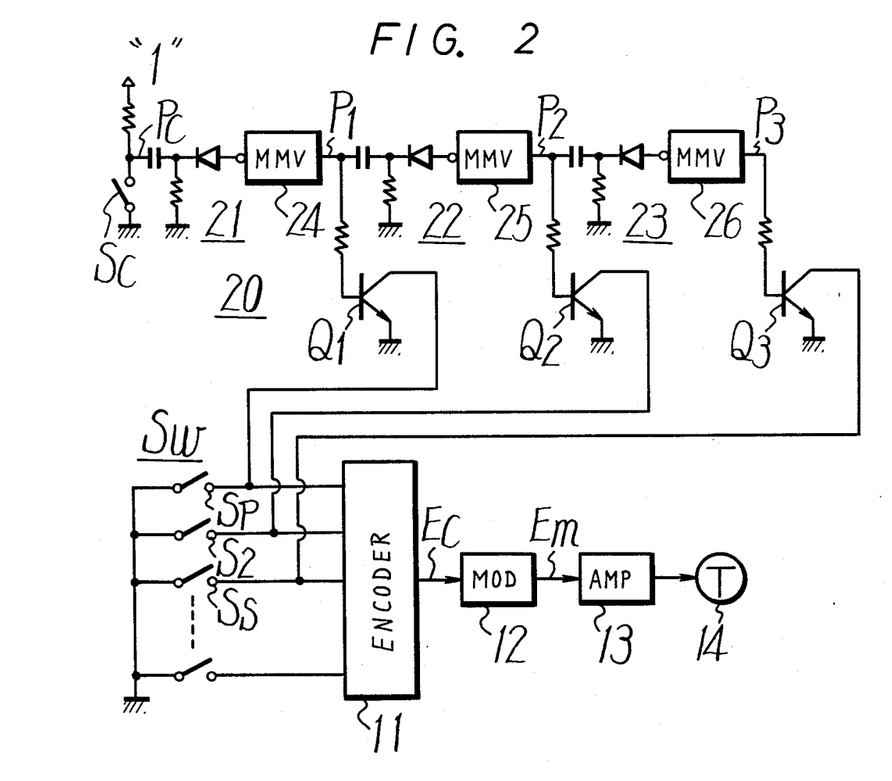
FIG. 2 is a partial block, partial schematic diagram of one embodiment of remote control transmitter apparatus of the present invention.

The present invention avoids the aforenoted difficulties, and permits the use of a simple, single control switch to condition VTR 1 and television receiver 4 for a playback operation. One embodiment of the present invention is illustrated in FIG. 2.

The illustrated embodiment is comprised of a multiple of function-selector switches $S_w$ and encoder 11 and a command signal transmitter comprised of an amplitude modulator 12, an amplifier 13 and a transmitting element 14. Encoder 11 is comprised of a plurality of inputs, each being coupled to a respective one of selector switches $S_w$. Depending upon which of these selector switches is actuated, or closed, a predetermined signal, such as ground, is applied to the corresponding input of encoder 11. The encoder may be of the conventional type which generates a plural-bit digital signal that is representative of the particular input to which the aforementioned predetermined signal is applied. Thus, encoder 11 functions to generate a digital representation of the particular selector switch $S_w$ which has been actuated. This encoded signal is supplied to amplitude modulator 12, whereat the plural bits of the digital signal amplitude-modulate a carrier. The amplitude-modulated carrier then is amplified by amplifier 13 and supplied to transmitting element 14. As one example thereof, the transmitting element comprises an infrared emitting diode such that the encoded signal generated by encoder 11, and representative of the particular selector switch which has been actuated, is transmitted as a modulated infrared beam. Alternatively, transmitting element 14 may comprise an ultrasonic emitter. Regardless of the particular construction of the transmitting element, it is appreciated that a suitably modulated carrier is transmitted thereby, which modulated carrier is received and detected by an associated remote control receiver (not shown).

Selector switches $S_w$ preferably are adapted to establish the foregoing modes of operation of VTR 1 as well as the foregoing modes of operation of television receiver 4. In the interest of brevity, only some of these selector switches are illustrated. For example, selector switch $S_p$ is provided to command VTR 1 to operate in its playback mode. Selector switch $S_2$ is provided to command television receiver 4 to be tuned to the aforementioned "unused" channel. Selector switch $S_s$ commands change-over switch 3 to interconnect VTR circuitry 2 and television receiver 4. Other selector switches also are provided, but in the interest of brevity and simplification, such additional switches are not shown.

Preferably, one terminal of each of selector switches $S_w$ is connected in common to a source of reference potential, such as ground. The other terminal of each of the selector switches is connected to a respective input of encoder 11. Hence, when playback selector switch $S_p$ is actuated, or closed, ground potential is supplied to the corresponding input of encoder 11, thereby resulting in the generation of a corresponding playback command signal $E_c$. When channel selector switch $S_2$ is actuated, or closed, ground potential is applied to another corresponding input of encoder 11, thereby resulting in the generation of the channel select command signal. Likewise, when connection selector switch $S_s$ is actuated, or closed, ground potential is applied to a still further corresponding input of encoder 11, thereby resulting in the generation of the VTR/TV connection command signal. Preferably, the selector switches are of the type which remain actuated only for so long as they are manually operated, or closed, and encoder 11 may be of the type which operates in response to the actuation of only a single selector switch. This avoids errors when plural selector switches are operated inadvertently, or when a selector switch is momentarily, unintentionally operated.

Figure 3A:
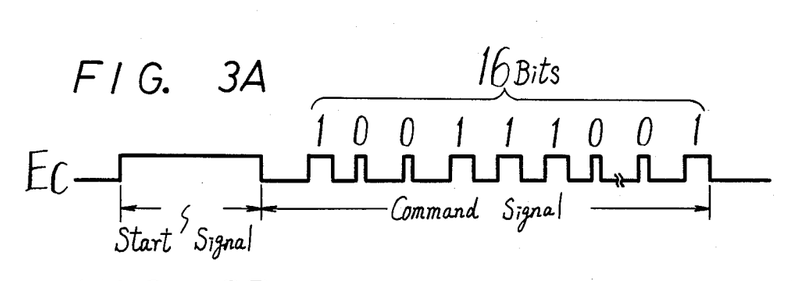
FIGS. 3A and 3B are waveform diagrams of a typical command signal that is generated by the apparatus shown in FIG. 2.

FIG. 3A is a waveform representation of the command signal $E_c$ which is generated by encoder 11 in response to the operation of one of selector switches $S_w$. As illustrated, when a selector switch is operated, the encoder transmits a start signal of constant duration, which start signal represents the beginning of the command signal and is used to synchronize the command signal detecting and decoding circuitry (not shown) included in the remote control receiving device. The digitally encoded command signal, which may be comprised of 16 bits, for example, follows the start signal, as illustrated. The binary "1"s and "0"s included in the command signal are represented by pulse durations.

That is, and as illustrated, a binary "1" is transmitted as a pulse signal whose duration is greater (e. g. twice) than the duration of the pulse signal which represents a binary "0". This 16-bit command signal is generated serially-by-bit.

Figure 3B:
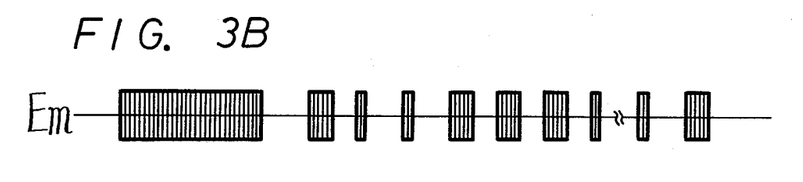

As mentioned above, command signal $E_c$ is modulated by amplitude-modulator 12, resulting in the modulated command signal $E_m$ illustrated in FIG. 3B. Alternatively, modulator 12 may be of a different type, capable of modulating a carrier with the binary information included in the generated command signal. Of course, the remote control receiver device should be compatible with modulator 12 so as to demodulate the received command signal. The remote control receiver device also includes a suitable decoder, whereby the 16-bit command signal is decoded to a corresponding function control signal. The apparatus used to decode the command signal and to implement the commanded operation are known to those of ordinary skill in the art. Hence, and in the interest of brevity, further description of such apparatus is not provided.

The remote control transmitter of the present invention also includes control switch $S_c$ and a control circuit 20. Control switch $S_c$ is manually operable and, when actuated, serves to operate control circuit 20, whereupon encoder 11 is controlled to generate successive command signals which serve to dispose VTR 1 in its playback mode, tune television receiver 4 to the "unused" channel and operate change-over switch to interconnect circuitry 2 and television receiver 4. Stated otherwise, the operation of control switch $S_c$ serves to simulate the successive operations of selector switches $S_p$, $S_2$ and $S_s$.

Control circuitry 20 is comprised of a plurality of cascaded monostable multivibrators 24, 25 and 26. Each monostable multivibrator is triggered in response to a negative-going transition supplied to the input thereof; and when triggered, each monostable multivibrator generates an output pulse of predetermined duration. Preferably, each monostable multivibrator generates an output pulse whose duration is greater than the overall duration of the command signal illustrated in FIG. 3A. In addition, differentiating circuits 21, 22 and 23 are coupled to the inputs of monostable multivibrators 24, 25 and 26, respectively.

As illustrated in FIG. 2, control switch $S_c$ is coupled to ground and, when actuated, or closed, connects ground potential to differentiating circuit 21. The output of this differentiating circuit is coupled to the input of monostable multivibrator 24, and the output of this monostable multivibrator is coupled, via differentiating circuit 22, to the input of monostable multivibrator 25. The output of monostable multivibrator 25 is coupled, via differentiating circuit 23, to the input of monostable multivibrator 26. Furthermore, the outputs of monostable multivibrators 24, 25 and 26 are coupled, via transistors $Q_1$, $Q_2$ and $Q_3$, respectively, to those inputs of encoder 11 which are also connected to playback selector switch $S_p$, channel selector switch $S_2$ and VTR/TV connection switch $S_s$, respectively. More particularly, the emitter electrodes of transistors $Q_1$, $Q_2$ and $Q_3$ are coupled, in common, to ground; and the collector electrodes of these transistors are connected to respective inputs of encoder 11. Thus, when a particular transistor is rendered conductive, ground potential is supplied thereby to the corresponding input of encoder 11. It is appreciated that, since ground potential also is supplied to this input when the appropriate selector switch $S_w$ is closed, the conduction of a particular transistor thus simulates the actuation, or closure, of a selector switch.

Figure 4A:
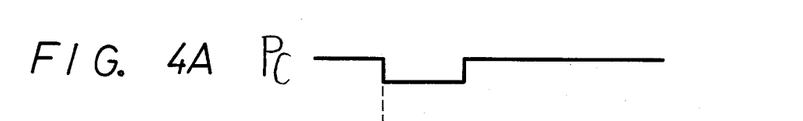
FIGS. 4A–4E are timing diagrams which are useful in understanding the operation of the embodiment shown in FIG. 2.
Figure 4B:
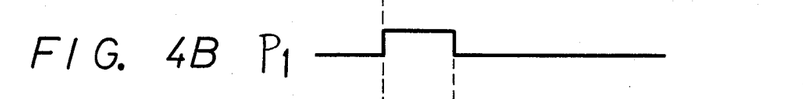

The input of differentiating circuit 21 is coupled via a resistor to a source of operating voltage. Control switch $S_c$ is coupled to ground and normally is "opened". Hence, a binary "1" normally is supplied to differentiating circuit 21. However, when control switch $S_c$ is closed, ground potential is supplied to this differentiating circuit. The negative-going transition which is produced by the closure of control switch $S_c$ is supplied via differentiating circuit 21 to the input of monostable multivibrator 24, thereby triggering this monostable multivibrator to its quasi-stable state. As a result thereof, monostable multivibrator 24 generates pulse signal $P_1$, shown in FIG. 4B. FIG. 4A represents the pulse $P_c$ that is generated by the operation of control switch $S_c$.

When monostable multivibrator 24 returns to its stable state, pulse signal $P_1$ undergoes a negative transition. This negative transistion is differentiated by differentiating circuit 22 and supplies a negative-going trigger pulse to monostable multivibrator 25, thereby triggering this monostable multivibrator to its quasi-stable state. As a result thereof, monostable multivibrator 25 generates the pulse signal $P_2$ shown in FIG. 4C. When monostable multivibrator 25 returns to its stable state, pulse signal $P_2$ undergoes a negative transition. This negative transition is differentiated by differentiating circuit 23 and supplies a negative-going trigger pulse to monostable multivibrator 26. Hence, monostable multivibrator 26 is triggered to its quasi-stable state, thereby generating pulse signal $P_3$, shown in FIG. 4D. It is appreciated that the cascaded monostable multivibrators function as a delay circuit to produce successively delayed pulse signals $P_1$, $P_2$ and $P_3$.

Figure 4C:
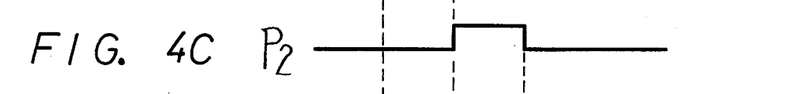
Figure 4D:
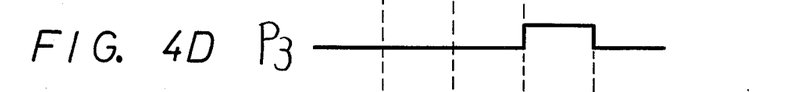
Figure 4E:
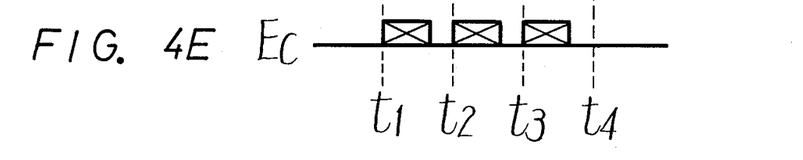

From FIGS. 4A–4D, it is appreciated that, in response to the closure of control switch $S_c$, successive pulse signals $P_1$, $P_2$ and $P_3$ are generated, in sequence, by monostable multivibrators 24, 25 and 26, respectively. Pulse signal $P_1$ renders transistor $Q_1$ conductive for the duration $t_1$ to $t_2$. Pulse signal $P_2$ renders transistor $Q_2$ conductive for the duration $t_2$ to $t_3$. Finally, pulse signal $P_3$ renders transistor $Q_3$ conductive for the duration $t_3$ to $t_4$. The conduction of transistor $Q_1$ simulates the closure of playback selector switch $S_p$. Similarly, the conduction of transistor $Q_2$ simulates the closure of channel selector switch $S_2$. Likewise, the conduction of transistor $Q_3$ simulates the closure of VTR/TV connection switch $S_s$. Consequently, encoder 11 generates the VTR playback command signal in response to pulse signal $P_1$. Similarly, the encoder generates the channel select command signal in response to pulse signal $P_2$. Likewise, the encoder generates the VTR/TV connection command signal in response to pulse signal $P_3$. These command signals are generated successively, and in sequence, as illustrated in FIG. 4E. As mentioned above, the duration of each command signal is less than the duration of each pulse generated by the monostable multivibrators. This timing relationship is clearly illustrated in FIG. 4E.

Thus, in response to the operation of control switch $S_c$, encoder 11 generates successive command signals, which command signals are received by VTR 1 and television receiver 4 to initiate the succesively commanded operations. In the foregoing example, the simple, single operation of control switch $S_c$ results in disposing VTR 1 in its playback mode, tuning television receiver 4 to the "unused" channel, and changing over switch 3 to electrically interconnect the VTR and television receiver. Hence, previously recorded video signals are reproduced by VTR 1, supplied to television receiver 4 and displayed on the display screen of the television receiver.

With the present invention, as illustrated in FIG. 2, it is sufficient to provide a single remote control transmitter unit having a single control switch $S_c$ in place of individual selector switches $S_p$, $S_2$ and $S_s$. Separate remote control units 6 and 7 may be replaced by a single, hand-held unit. Thus, the manufacture of remote control units is relatively simplified because a single, integral unit may be made for controlling both VTR 1 and television receiver 4, and this single unit may be provided additionally with control switch $S_c$ and control circuitry 20, the latter preferably being manufactured in accordance with conventional integrated circuit fabrication techniques.

In the example shown in FIG. 2, three separate functions are commanded in order to carry out a playback operation, viz.: disposing the VTR in its playback mode, tuning the television receiver to the "unused" channel and interconnecting VTR circuitry 2 with the television receiver. If desired, one of these functions may be carried out manually and the remaining two operations may be controlled via the remote control unit. In that event, only two monostable multivibrators are needed; and one of selector switches $S_p$, $S_2$ and $S_s$ may be omitted. Nevertheless, the operation of the illustrated apparatus proceeds in the manner discussed in detail hereinabove.

Figure 5:
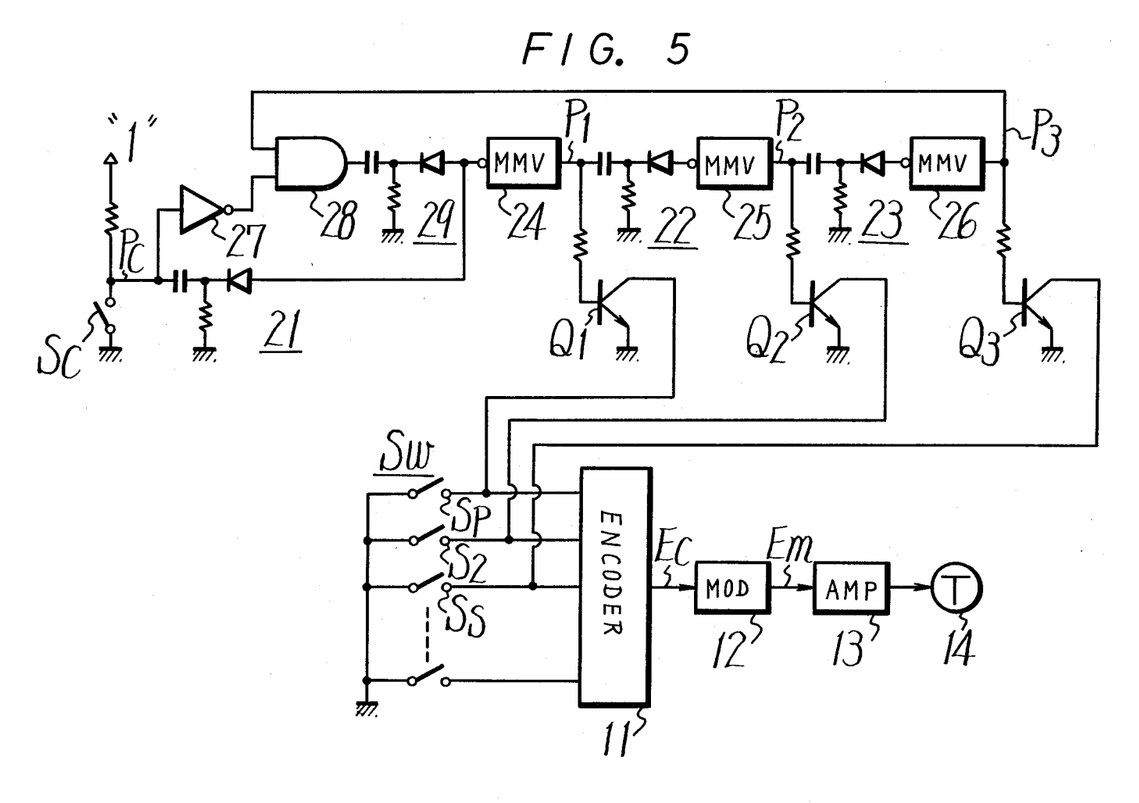
FIG. 5 is a partial block, partial schematic diagram of another embodiment of the present invention.

Furthermore, in the example shown in FIG. 2, the sequence of pulse signals $P_1$, $P_2$ and $P_3$ is generated only once in response to the operation, or closure, of control switch $S_c$. It is possible that the succession of transmitted command signals may not be fully and properly received and detected during this single sequence. It may, therefore, be desired to generate repeated sequences of the command signals for so long as control switch $S_c$ remains operated. A suitable remote control transmitter device, in accordance with the present invention, and capable of generating and transmitting repeated sequences of successive command signals is illustrated in FIG. 5. The circuitry shown in FIG. 5 is substantially similar to that discussed hereinabove with respect to FIG. 2; and like reference numerals are used to identify the corresponding parts. In the interest of brevity, only the difference between the control circuits illustrated in FIGS. 2 and 5 will be described.

Like the embodiment shown in FIG. 2, the apparatus of FIG. 5 is comprised of cascaded monostable multivibrators 24, 25 and 26, negative-going trigger pulses being supplied thereto by differentiating circuits 21, 22 and 23, respectively. Thus, in the FIG. 5 embodiment, when control switch $S_c$ is closed, negative-going pulse $P_c$ (FIG. 4A) is generated. The negative transition of this pulse $P_c$ is differentiated by differentiating circuit 21 so as to trigger monostable multivibrator 24. This monostable multivibrator generates pulse signal $P_1$ (FIG. 4B); and this pulse signal $P_1$ simulates the closure of playback switch $S_p$. When pulse signal $P_1$ terminates, differentiating circuit 22 triggers monostable multivibrator 25 to generate pulse signal $P_2$ (FIG. 4C). This pulse signal $P_2$ simulates the closure of channel select switch $S_2$. Upon the termination of pulse signal $P_2$, differentiating circuit 23 triggers monostable multivibrator 26 to generate pulse signal $P_3$ (FIG. 4D). This pulse signal $P_3$ simulates the closure of VTR/TV connection switch $S_s$.

In addition, FIG. 5 includes a repeat circuit which is comprised of a logic inverter 27, an AND gate 28 and a differentiating circuit 29. AND gate 28 includes one input coupled via inverter 27 to control switch $S_c$. Another input of AND gate 28 is coupled to the output of monostable multivibrator 26 to receive pulse signal $P_3$.

In operation, it is appreciated that, initially, monostable multivibrator 26 assumes its stable state, whereupon the output thereof corresponds to a binary "0". Hence, initially, AND gate 28 is disabled. When control switch $S_c$ is closed, the negative-going pulse signal $P_c$ (FIG. 4A) generated thereby is inverted by inverter 27 to condition, or enable, AND gate 28. That is, AND gate 28 is enabled for the entire duration that control switch $S_c$ remains operating. As before, in response to the operation of control switch $S_c$, pulse signals $P_1$, $P_2$ and $P_3$ are generated, in sequence, by monostable multivibrators 24, 25 and 26, respectively. Now, when pulse signal $P_3$ (FIG. 4D) is generated, this pulse signal coincides with the binary "1" supplied to AND gate 28 from control switch $S_c$ via inverter 27. Therefore, AND gate 28 now is supplied with a binary "1" at each input thereof so as to produce a binary "1" output. When pulse signal $P_3$ terminates at time $t_4$ (FIG. 4D), a negative transition is produced at the output of AND gate 28. This negative transition is differentiated by differentiating circuit 29 and supplied as a trigger signal to the input of monostable multivibrator 24. Consequently, the aforedescribed sequence by which pulse signals $P_1$, $P_2$ and $P_3$ are generated, is repeated. This repetition of successive pulse signals continues until control switch $S_c$ is opened. At that time, a binary "1" is supplied to inverter 27, resulting in a binary "0" disable signal supplied to AND gate 28.

While the present invention has been particularly shown and described with reference to preferred embodiments thereof, it will be readily appreciated that various changes and modifications in form and details may be made without departing from the spirit and scope of the invention. For example, the present invention can be employed to remotely control selected operations of other devices, and this invention need not be limited solely for use with video playback and display devices. Also, in the embodiments shown in FIGS. 2 and 5, the monostable multivibrators may be replaced by delay circuits for generating successive, delayed pulses $P_1$, $P_2$ and $P_3$ in response to the operation of control switch $S_c$. For example, a suitable shift register, such as a 3-stage shift register may be used, the output of each stage being connected to a respective input of encoder 11. Also, other suitable pulse generators other than the aforedescribed triggerable monostable multivibrators may be used to generate pulses $P_1$, $P_2$ and $P_3$, in succession.

It is, therefore, intended that the appended claims be interpreted as including the foregoing as well as various other changes and modifications.

What is claimed is:

1. Remote control apparatus for generating and transmitting command signals to a video playback device and to a video display device for controlling said devices to play back and display video signals, comprising:
   a plurality of command switches, each being selectively operable to command a predetermined device to perform a particular function, said command switches including at least a playback command switch to command said video playback device to perform a playback operation and a channel select command switch to command said video display device to select a predetermined channel over which played back video signals are displayed, encoder means having plural inputs coupled to respective ones of said command switches and responsive to the selective operation of a command switch to generate an encoded representation of the function commanded by the operated switch, transmitting means coupled to said encoder means for transmitting said encoded representation to said video playback and display devices, selectively operable control switch means, and control means coupled to said encoder means and responsive to the operation of said control switch means to cause said encoder means to generate successive encoded representations of at least the functions commanded by said playback and channel select command switches.

2. The apparatus of claim 1; wherein said control means comprises pulse generating means for generating a pulse in response to the operation of said control switch means; and delay means for delaying said generated pulse by successive periods of time to produce successively delayed pulse, each of said delayed pulses being supplied to said encoder means to simulate the operation of a respective one of said at least playback and channel select command switches.

3. The apparatus of claim 2; wherein said encoder means includes at least first and second inputs coupled to said at least playback and channel select command switches, respectively, for receiving signals in response to the operation thereof; and wherein said control means further comprises means for supplying said successively delayed pulses to said first and second inputs, in succession, to simulate the signals received by said first and second inputs in response to the operation of said at least playback and channel select command switches.

4. The apparatus of claim 3 wherein said control means further comprises repeat means responsive to the continued operation of said control switch means for repeatedly supplying said successively delayed pulses to said first and second inputs of said encoder means.

5. Remote control apparatus for generating and transmitting command signals to a video playback device and to a video display device for controlling said devices to play back and display video signals, comprising: a plurality of command switches, each being selectively operable to command a predetermined device to perform a particular function, said command switches including a playback command switch to command said video playback device to perform a playback operation, a channel select switch to command said video display device to select a predetermined channel over which played back video signals are displayed, and a connection command switch to command the establishing of an electrical connection between said video playback and display devices through which said played back video signals are coupled from said video playback device to said video display device; encoder means having plural inputs coupled to respective ones of said command switches and responsive to the selective operation of a command switch to generate an encoded representation of the function commanded by the operated switch; transmitting means coupled to said encoder means for transmitting said encoded representation to said video playback and display devices: selectively operable control switch means; and control means coupled to said encoder means and responsive to the operation of said control switch means to cause said encoder means to generate successive encoded representations of at least the functions commanded by said playback, channel select and connection command switches.

6. The apparatus of claim 5 wherein each of said command switches applies an actuating signal to a respective input of said encoder means when operated; and wherein said control means includes means for supplying actuating signals successively to predetermined inputs of said encoder means.

7. The apparatus of claim 6 wherein said means for supplying actuating signals successively to predetermined inputs of said encoder means comprises pulse generating means responsive to the operation of said control switch means for generating successive actuating pulse signals, and means for applying respective ones of said successive actuating pulse signals to said predetermined inputs of said encoder means.

8. The apparatus of claim 7 wherein said pulse generating means comprises a plurality of monostable multivibrator means triggered in sequence in response to the operation of said control switch means for generating said successive actuating pulse signals.

9. The apparatus of claim 8 wherein said monostable multivibrator means are connected in cascade, each triggerable to generate an actuating pulse signal of predetermined duration.

10. The apparatus of claim 9 wherein said means for applying respective ones of said successive actuating pulse signals to said predetermined inputs of said encoder means comprises a respective transistor means coupled between a monostable multivibrator means and a said predetermined input.

11. The apparatus of claim 8 wherein said control means further includes repeat means operable in response to the operation of said control switch means for repeatedly triggering said plurality of monostable multivibrator means.

12. The apparatus of claim 11 wherein said plurality of monostable multivibrator means are connected in cascade and are triggered in sequence; and wherein said repeat means comprises gate means actuated in response to the operation of said control switch means and coupled to a predetermined monostable multivibrator means for producing a triggering signal when said predetermined monostable multivibrator means generates an actuating pulse signal, said triggering signal being supplied to trigger said cascaded monostable multivibrator means in sequence.

13. The apparatus of claim 12 wherein said gate means is actuated for so long as said control switch means is operated; whereby said cascaded monostable multivibrator means are repeatedly triggered in sequence for the duration that said control switch means is operated.

14. Remote control apparatus for generating and transmitting remote control signals for controlling the operations of at least first and second devices, comprising:
at least first and second switches;
said first switch being selectively operable to cause said first device to carry out a predetermined operation;

said second switch being selectively operable to cause said second device to cooperate with said first device and carry out a predetermined operation;

encoder means including at least first and second inputs coupled to said at least first and second switches, respectively, for receiving signals in response to the operation thereof to generate an encoded representation of the operated switch;

transmitting means coupled to said encoder means for transmitting said encoded representation to said first and second devices as an encoded command signal to command at least one of said devices to carry out the predetermined operation selected by the operated switch;

selectively operable control switch means; and control means including pulse generating means for generating a pulse in response to the operation of said control switch means, delay means including at least first and second cascaded monostable multivibrator means, said first monostable multivibrator means being triggered by said pulse generating means for generating a first delayed pulse, and said second monostable multivibrator means being triggered by the termination of said first delayed pulse for generating a second delayed pulse, and means for supplying said first and second delayed pulses to said first and second inputs of said encoder means, in succession, to simulate the signals received by said first and second inputs in response to the operation of said at least first and second switches, whereby said encoder means responds to the operation of said control switch means ot generate successive encoded representations of said at least first and second switches.

15. The apparatus of claim 14, wherein said control means further comprises first and second differentiator means coupled to said first and second monostable multivibrator means, respectively, for supplying thereto a predetermined pulse transition to trigger said monostable multivibrator means.

16. Remote control apparatus for generating and transmitting remote control signals for controlling the operations of at least first and second devices, comprising:

at least first and second switches;

said first switch being selectively operable to cause said first devide to carry out a predetermined operation;

said second switch being selectively operable to cause said second device to cooperate with said first device and carry out a predetermined operation;

encoder means including at least first and second inputs coupled to said at least first and second switches, respectively, for receiving signals in response to the operation thereof to generate an encoded representation of the operated switch;

transmitting means coupled to said encoder means for transmitting said encoded representation to said first and second devices as an encoded command signal to command at least one of said devices to carry out the predetermined operation selected by the operated switch;

selectively operable control switch means; and control means including pulse generating means for generating pulse in response to the operation of said control switch means, delay means including at least first and second cascaded monostable multivibrator means, said first monostable multivibrator means being triggered by said pulse generating means for generating a first delayed pulse and said second monostable multivibrator means being triggered by the termination of said first delayed pulse for generating a second delayed pulse, repeat means comprising gate means enabled by the continued operation of said control switch means for feeding back said second delayed pulse to said first monostable multivibrator means, whereby said first monostable multivibrator means is repeatedly triggered by the termination of each said second delayed pulse for so long as said gate means is enabled, and means for supplying said first and second delayed pulses to said first and second inputs of said encoder means, in succession, to simulate the signals received by said first and second inputs in response to the operation of said at least first and second switches, whereby said encoder means responds to the operation of said control switch means to generate successive encoded representations of said at least first and second switches.

* * * * *